(12) United States Patent
Yutani (10) Patent No.: US 6,686,621 B2
(45) Date of Patent: Feb. 3, 2004

(54) SEMICONDUCTOR DEVICE (75) Inventor: Akie Yutani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/196,951

(22) Filed: Jul. 18, 2002

(65) Prior Publication Data

US 2003/0015675 A1 Jan. 23, 2003

(30) Foreign Application Priority Data

Jul. 19, 2001 (JP) ........................................ 2001-219279

(51) Int. Cl.[7] .................... H01L 29/78; H01L 27/108
(52) U.S. Cl. .................... 257/309; 257/306; 257/310; 257/311
(58) Field of Search .................... 257/306, 309, 257/310, 311

(56) References Cited

U.S. PATENT DOCUMENTS 5,567,964 A  10/1996  Kashihara et al.
5,696,395 A  * 12/1997  Tseng .................... 257/308

FOREIGN PATENT DOCUMENTS

| JP | 6-132482    | 5/1994 |
| JP | 7-94600     | 4/1995 |
| JP | 9-64298     | 3/1997 |
| JP | 2000-124416 | 4/2000 |
| JP | 2000-183305 | 6/2000 |

* cited by examiner

Primary Examiner—Jerome Jackson
(74) Attorney, Agent, or Firm—McDermott, Will & Emery (57) ABSTRACT A semiconductor device which includes a capacitor wherein the capacitance of the capacitor can be prevented from being lowered even in the case that the capacitor is miniaturized. A core insulating film having the core of the capacitor formed above a semiconductor substrate, a capacitor lower electrode formed so as to cover side surfaces of this core insulating film, a capacitor dielectric film formed so as to cover the surface of this capacitor lower electrode and the upper surface of the core insulating film and a capacitor upper electrode formed so as to cover the surface of this core insulating film are provided so that the bottom surface of the core insulating film is positioned lower than the bottom surface of the capacitor lower electrode.

5 Claims, 12 Drawing Sheets

SEMICONDUCTOR DEVICE

BACKGROUND OF THE INVENTION

1. Field of the Invention

The present invention relates to a semiconductor device which includes a capacitor having a damascene pillar-type cell.

2. Description of the Background Art

Figure 13:
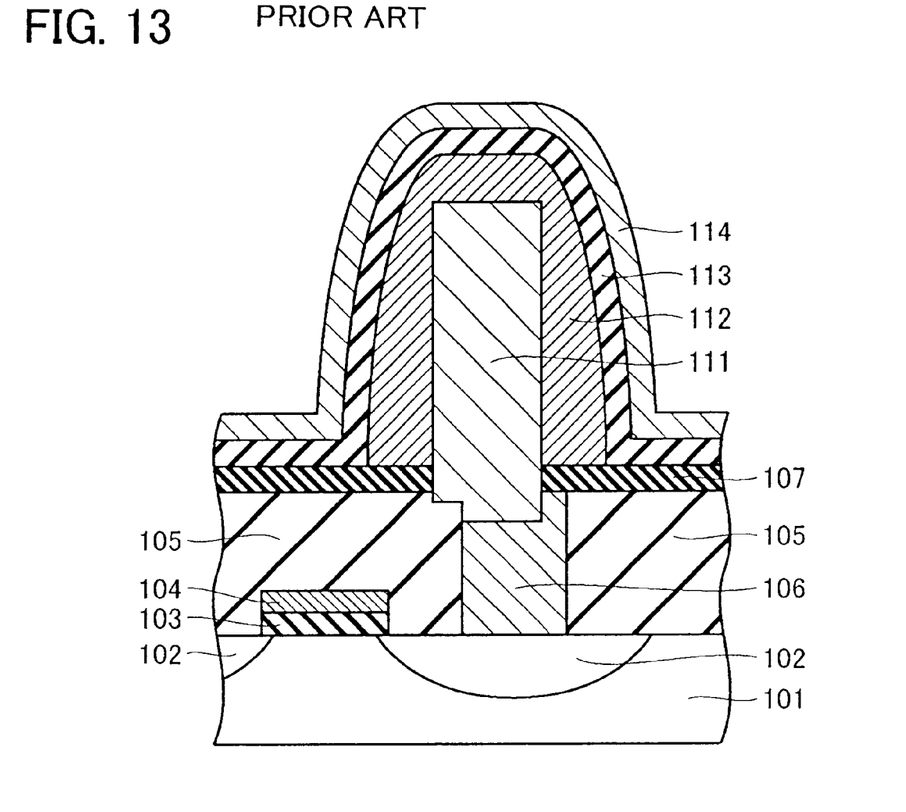
FIG. 13 is a diagram for describing a structure of a semiconductor device which includes a capacitor having a conventional damascene pillar-type cell.

Conventionally, a damascene pillar-type cell structure has been used for capacitors in semiconductor devices. A damascene pillar-type cell is formed by applying a damascene pillar process and is a cell in a form where a capacitor lower electrode 112, a capacitor dielectric film 113 and a capacitor upper electrode 114 are layered on each other so as to form a bell shape, as shown in FIG. 13. As for the form, it is similar to a stack type capacitor and the characteristic thereof is that misalignment in a photomechanical process for a capacitor lower electrode can be overcome by means of the following process. In the following, a summary of a conventional process for a capacitor of a damascene pillar-type cell is given. Here, the structures of a semiconductor substrate 101, source/drain regions 102, a gate insulating film 103, a gate electrode 104, an interlayer insulating film 105 and a contact plug 106 are similar to those in a conventional art and, therefore, the description of the process is omitted.

Figure 14:
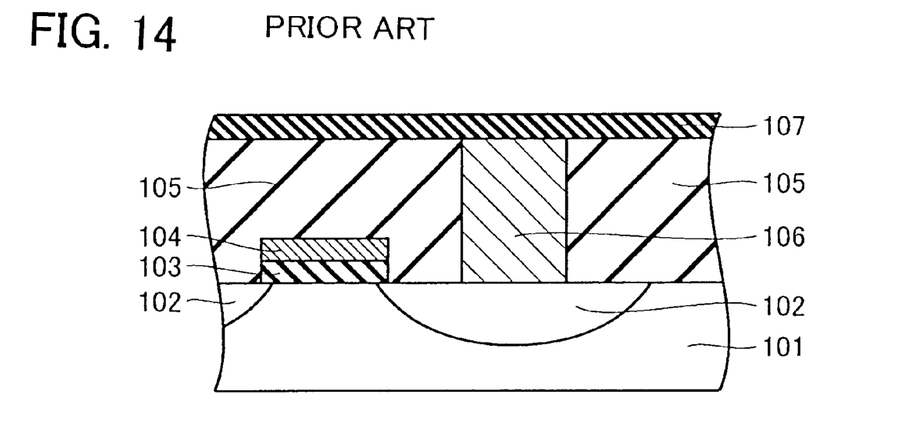
FIG. 14 is a diagram for describing a process for a semiconductor device which includes a capacitor having a conventional damascene pillar-type cell.

A capacitor having a conventional damascene pillar-type cell is formed by a conventional process as shown in FIG. 14 such that after forming contact plug (poly Si or metal such as TiN, W) 106 in interlayer insulating film 105, the entirety of the upper surfaces of both interlayer insulating film 105 and contact plug 106 is covered with a silicon nitride film 107. Here, the film thickness of a representative silicon nitride film 107 is several tens of nm.

Figure 15:
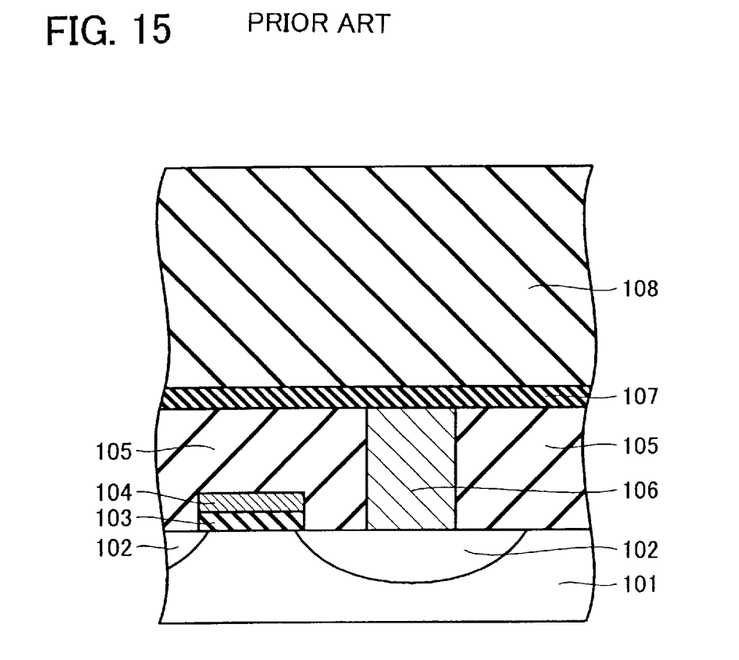
FIG. 15 is a diagram for describing the process for a semiconductor device which includes a capacitor having a conventional damascene pillar-type cell.
Figure 16:
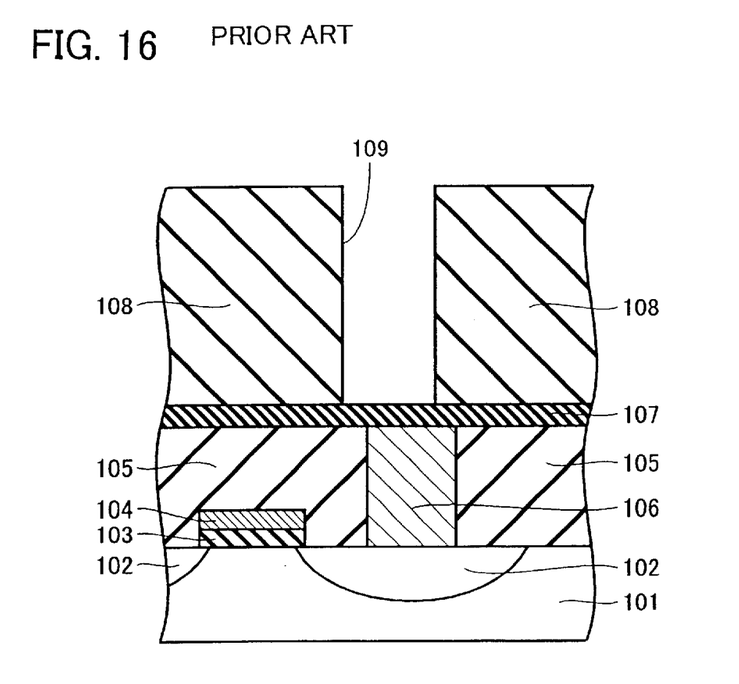
FIG. 16 is a diagram for describing the process for a semiconductor device which includes a capacitor having a conventional damascene pillar-type cell.
Figure 17:
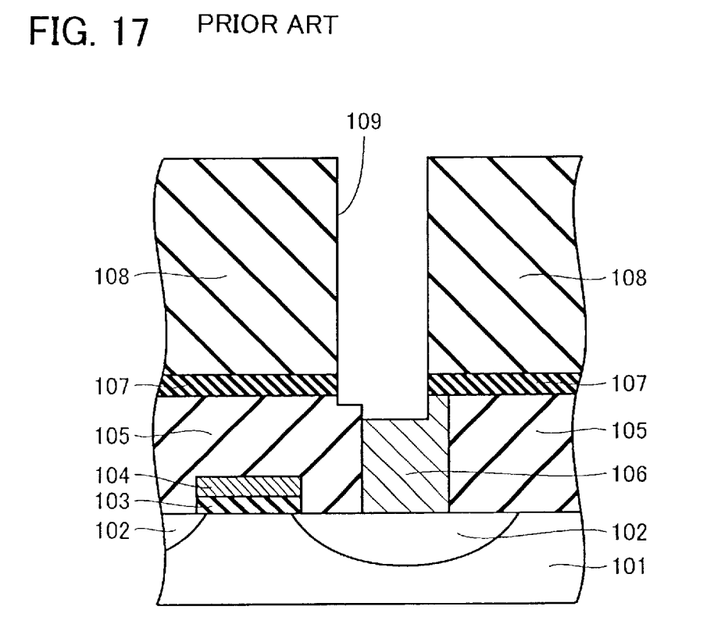
FIG. 17 is a diagram for describing the process for a semiconductor device which includes a capacitor having a conventional damascene pillar-type cell.

Next, as shown in FIG. 15, the upper surface of silicon nitride film 107 is further covered with a silicon oxide film 108. Here, the thickness of silicon oxide film 108 depends on height of the cell and is approximately several hundreds of nm. Next, as shown in FIG. 16, a contact hole 109 is created in silicon oxide film 108 so that the surface of silicon nitride film 107 is exposed. Next, as shown in FIG. 17, the bottom of contact hole 109 is further etched so as to penetrate silicon nitride film 107 and to extend contact hole 109 to the degree that contact plug 106 and interlayer insulating film 105 are slightly etched.

Here, as for the creation of contact hole 109, an opening is created in silicon oxide film 108 by using a photomechanical process and etching wherein what is important is that there is an advantage in a capacitor having a damascene pillar-type cell that a positional shift between the opening and contact plug 106 can be overcome, unless contact hole 109 completely misses contact plug 106 unlike in a conventional stack-type cell. In FIG. 17 the case is shown where a misalignment is purposefully formed in order to emphasize the above point. Here, in practice, framing, such as of TEOS, may be carried out in some cases after creating the opening for the purpose of making the diameter of the contact hole smaller.

In addition, silicon nitride film 107 is etched in a self-aligning manner and, in the case that contact hole 109 misses contact plug 106 at this point in time, a portion of interlayer insulating film 105 and a portion of contact plug 106 below silicon nitride film 107 are etched. Usually, the etching rate of contact plug 106 is faster than that of interlayer insulating film 105 and, therefore, a structure in a step form as shown in FIG. 17 is formed.

Figure 18:
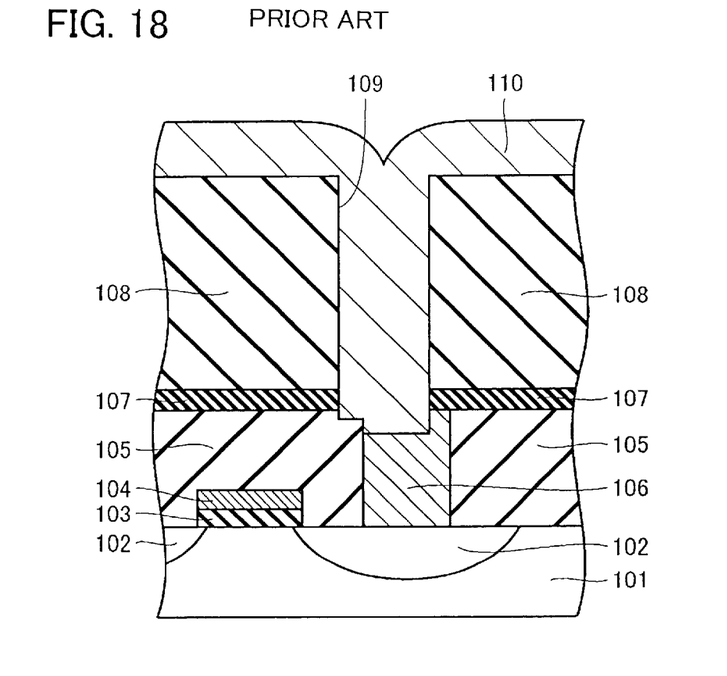
FIG. 18 is a diagram for describing the process for a semiconductor device which includes a capacitor having a conventional damascene pillar-type cell.

Next, as shown in FIG. 18, the opening of contact hole 109 is filled in with, and the upper surface of silicon oxide film 108 is covered with, a metal 110 which will become capacitor lower electrode 112. The filling in method is not particularly limited, however, a CVD (Chemical Vapor Deposition) method is desirable from the point of view of coverage.

Figure 19:
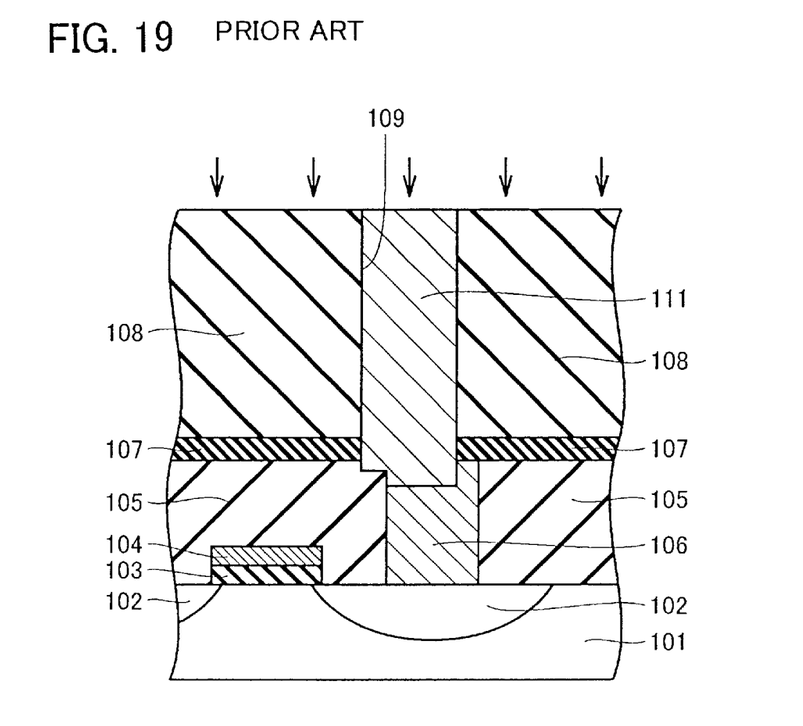
FIG. 19 is a diagram for describing the process for a semiconductor device which includes a capacitor having a conventional damascene pillar-type cell.

Next, as shown in FIG. 19, an etch back for flattening is carried out so as to remove metal 110, other than the portion which has been filled in and a metal 111 is formed. This etch back method uses conventional dry etching, CMP (chemical mechanical polishing), or the like.

Figure 20:
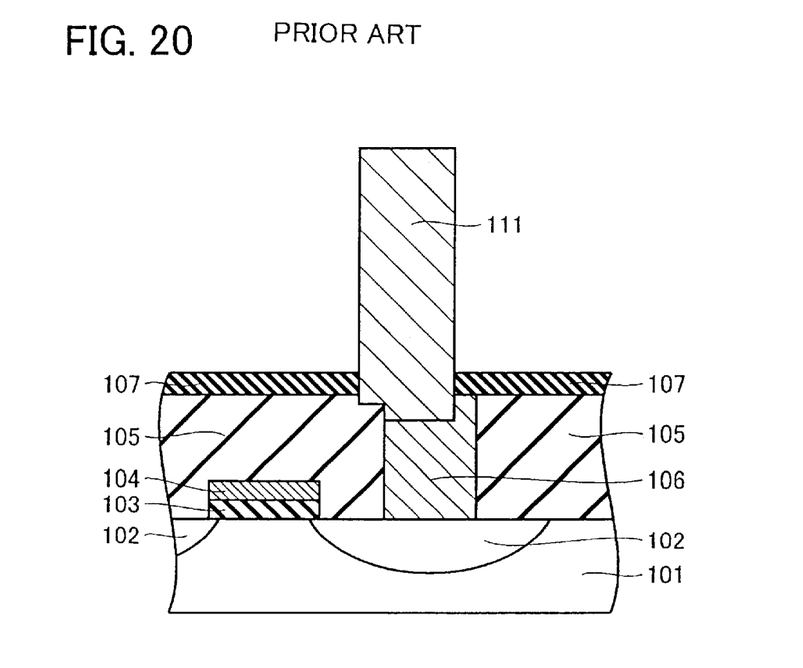
FIG. 20 is a diagram for describing the process for a semiconductor device which includes a capacitor having a conventional damascene pillar-type cell.

Next, as shown in FIG. 20, etching off of silicon oxide film 108 is carried out. This etching off is possible by means of conventional wet etching and dry etching may be used at the same time. At this point in time, a pillar-type capacitor lower electrode 112 is formed in a self-aligning manner with respect to metal 111. By using such a formation method, the entirety is in a form of being covered with silicon nitride film 107, other than on the portion where capacitor lower electrode 112 and contact plug 106 make contact where each other and, therefore, a misalignment, if any, will not effect subsequent steps.

Figure 21:
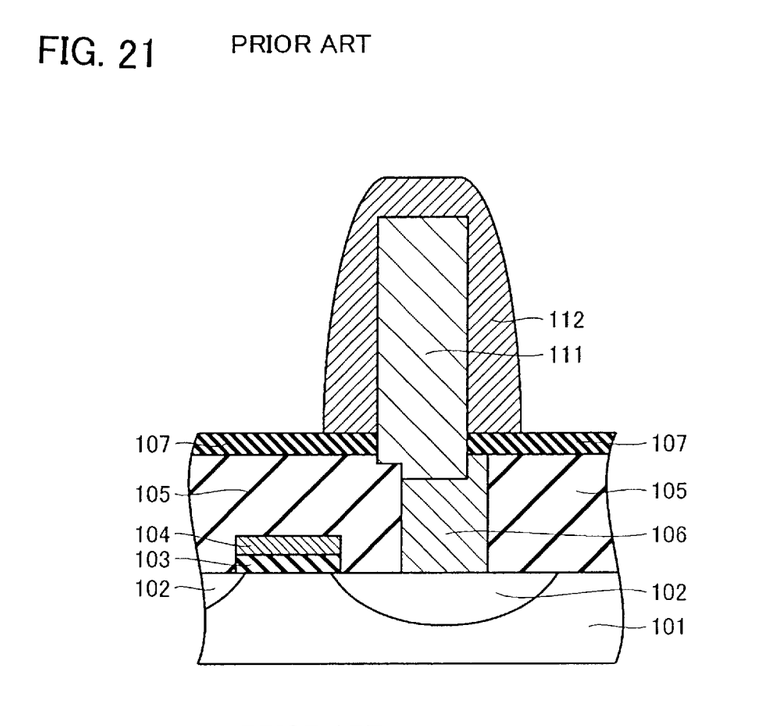
FIG. 21 is a diagram for describing the process for a semiconductor device which includes a capacitor having a conventional damascene pillar-type cell.

Next, as shown in FIG. 21, a side wall film is formed by using the pillar of a damascene pillar-type cell as a core. Side wall film 112 may be made of the same material as the core or may be of a different material. Here, in some cases, this process may be omitted. The thickness of side wall film 112 is, in general, several tens of nm of the thickness of the flat portion. Concretely, the formation of the side wall film is possible by carrying out an etch back for the entire surface after depositing a material for capacitor lower electrode 112. According to this method, the top surface of the capacitor lower electrode may be lost but, even if so, no problems arise concerning the performance of the capacitor.

Figure 22:
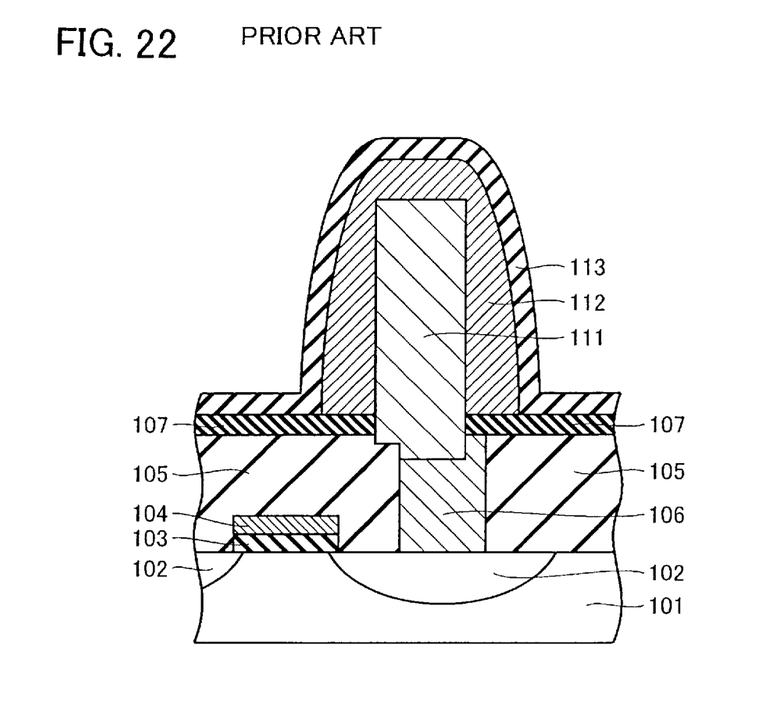
FIG. 22 is a diagram for describing the process for a semiconductor device which includes a capacitor having a conventional damascene pillar-type cell.

Next, as shown in FIG. 22, capacitor dielectric film 113 is formed. The film thickness is from approximately several nm to several tens of nm. Next, capacitor upper electrode 114 of which the film thickness is approximately several tens of nm is formed on capacitor dielectric film 113. After this, the formation of a conventional interlayer insulating film and an aluminum wiring process are carried out and, thereby, a capacitor having a damascene pillar-type cell is formed. Here, unnecessary portions of capacitor upper electrode 114 are capacitor dielectric film 113 are removed through etching, or the like, so as to complete a capacitor of a structure as shown in FIG. 13.

In a capacitor having a damascene pillar-type cell of the above described structure, when the film thickness of the dielectric film is reduced together with the scaling down of the design rule, the dielectric constant is lowered so as to so that the capacitance of the capacitor is lowered. In this damascene pillar structure, it is necessary to make the thickness of the dielectric film thin in order to sufficiently cover the cell with the cell plate when the design rule is scaled down to approximately 0.10 $\mu$m. However, in a crystallized dielectric such as a perovskite dielectric film the dielectric constant is often lowered when the film thickness is made thinner (to 10 nm). This is because a high dielectric constant occurs due to displacement of Ti atoms in the crystal lattice and because the crystal structure is affected and the crystal lattice is disturbed when the film thickness becomes smaller. Therefore, even in the case that the film thickness is made thinner, an increase of a leak current occurs instead of the increase in the capacitance of the capacitor.

Figure 23:
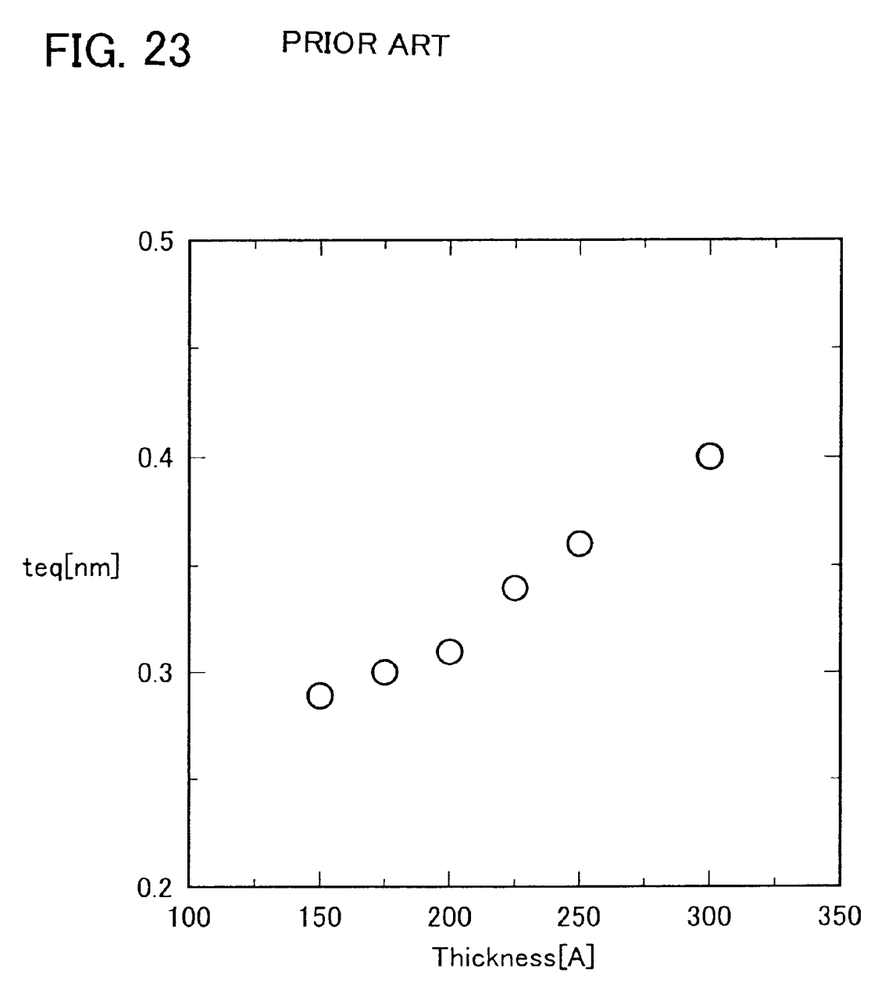
FIG. 23 is a graph showing a mutual relationship between the film thickness of a capacitor dielectric film and the film thickness as converted to oxide film teq.

FIG. 23 shows the mutual relationship between the actual film thickness and the film thickness as converted to oxide film teq as an example of the occurrence of the above leak current. As can be seen from a graph shown in this FIG. 23, the smaller the film thickness of capacitor dielectric film 113 becomes, the smaller becomes the degree of reduction of the film thickness as converted to oxide film teq, that is to say, in the conventional structure of a damascene pillar-type cell, the greater is the miniaturization of the capacitor, the further the capacitance of the capacitor is lowered.

SUMMARY OF THE INVENTION

A purpose of the present invention is to provide a semiconductor device which includes a capacitor wherein the capacitance of the capacitor can be prevented from being lowered, even when the capacitor is miniaturized.

A semiconductor device of the present invention has a core insulating film which forms the core of a capacitor formed on a semiconductor substrate, a capacitor lower electrode formed so as to cover the side surfaces of the above core insulating film, a capacitor dielectric film formed so as to cover the surface of the above capacitor lower electrode and the top surface of the core insulating film and a capacitor upper electrode formed so as to cover (on) the surface of the above capacitor dielectric film, wherein the bottom surface of the core insulating film is located below the bottom surface of the capacitor lower electrode. In such a structure, the core insulating film is formed as the core of the capacitor and, thereby, the capacitance of the capacitor can be increased by an amount corresponding to the electric flux lines occurring between the inner surface of the capacitor lower electrode and the capacitor upper electrode. In addition, since the bottom surface of the core insulating film is positioned below the bottom surface of capacitor lower electrode, the entirety of the inside surface of the capacitor lower electrode can be made to contribute to an increase in the capacitance of the capacitor. As a result, a semiconductor device which includes a capacitor can be gained wherein the capacitance of the capacitor can be prevented from being lowered even when the capacitor is miniaturized.

In the semiconductor device of the present invention, the top surface of the core insulating film is preferably in a position lower than the top edge of the capacitor lower electrode. In such a structure, the inside surface portion on the top side of the capacitor upper electrode of the area where the capacitor upper electrode and the capacitor lower electrode face each other can be made large and, thereby, the capacitance of the capacitor can be made large.

The semiconductor device of the present invention preferably has a plug electrically connected to the capacitor lower electrode and the width of the plug is larger than the width of the core insulating film in a predetermined cross section of the core insulating film. In such a structure, the entirety of the top surface of the plug can be prevented from being included inside of the bottom surface of the core insulating film and, therefore, the bottom surface of the capacitor lower electrode can be prevented from being completely unconnected to the top surface of the plug.

Moreover, in the semiconductor device of the present invention the connection portion wherein the bottom surface of the core insulating film is connected to the contact plug and the portion other than the connection portion may form a step form. In such a structure, a core insulating film can be formed by means of a simple process without undue regard to the etching rate for etching the hole for forming a plug.

In the semiconductor device of the present invention, the core insulating film is preferably a high dielectric film. Because the core insulating film is a high dielectric film the capacitance of the capacitor can be further increased in comparison with the insulating film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention are described in reference to the drawings.

(First Embodiment)

Figure 1:
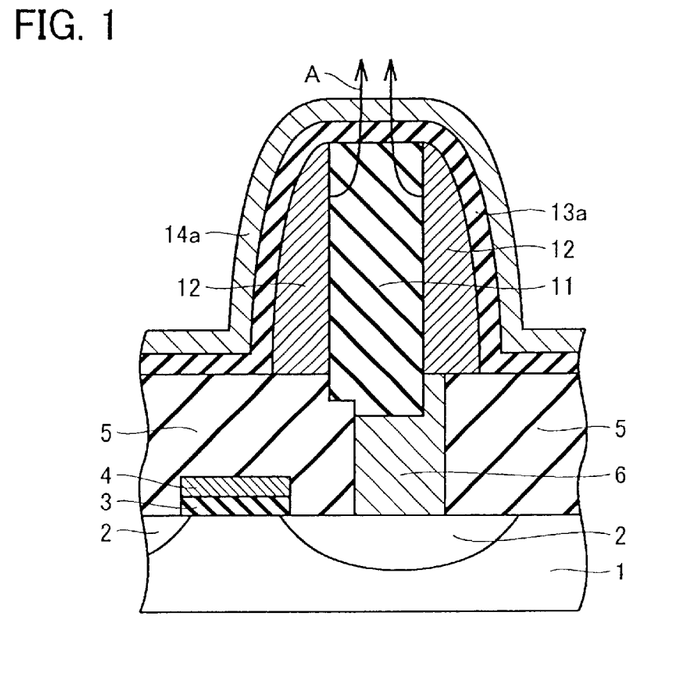
FIG. 1 is a view showing a semiconductor device which includes a capacitor structure having the damascene pillar-type cell of a first embodiment.

First, the structure of a semiconductor device which includes a capacitor of damascene pillar-type cell of the present embodiment is described. In the semiconductor device having a damascene pillar-type cell of the present embodiment, as shown in FIG. 1, impurity diffusion regions are formed so as to construct source/drain regions 2 of a predetermined value which spread from the main surface to a predetermined depth in a semiconductor substrate 1. In addition, a gate insulating film 3 and a gate electrode 4 are formed above the channel region between two source/drain regions 2. Furthermore, a silicon oxide film 5 is formed so as to cover the main surface of semiconductor substrate 1, source/drain regions 2, gate insulating film 3 and gate electrode 4.

In addition, a contact plug 6 made of a metal is formed as a contact plug penetrating silicon oxide film 5. Furthermore, a core insulating film 11 extends in the direction perpendicular to the main surface of semiconductor substrate 1 while causing a misalignment with contact plug 6. In addition, a side wall film is formed so as to cover the side surface around the above core insulating film 11. This side wall film is made of a metal and functions as a capacitor lower electrode 12. In addition, a capacitor dielectric film 13a is formed so as to cover the surface of capacitor lower electrode 12 and the top surface of core insulating film 11. Furthermore, a capacitor upper electrode 14a is formed so as to cover the entirety of the surface of capacitor dielectric film 13a.

In the above described structure, it becomes possible to utilize a core portion with a high dielectric constant. That is to say, in the above described structure the film thickness of core insulating film 11 becomes the film thickness wherein the entirety of the inner portion of capacitor lower electrode 12 is buried, which is quite thick having a minimum thickness of 100 nm, or greater, and having a conventional thickness of several hundreds of nm. Therefore, the structure can prevent the dielectric constant from being lowered due to the reduction, as shown in the prior art, of the film thickness of the dielectric film.

Next, in the case that a cell structure is manufactured by using a film of which the dielectric constant is high as described above and that the distance starting from capacitor lower electrode 12, in a cylinder form, to capacitor upper electrode 14a becomes comparatively large, dotted line A as shown in the figure easily occurs. Thereby, core insulating film 11 contributes to the increase in the entire capacitance of the capacitor.

In addition, when the above described structure is adopted, the same effects are gained as to make the film thickness thicker on the cell. Therefore, components from the leak current which have come from the top surface of the cell can be suppressed. As a result, effects are gained which prevent the reduction of the leak current from the cell. Here, there are two examples of a "damascene pillar-type cell" and a "framing-type cell" as prior arts while the present embodiment is characterized in that a high dielectric film used for core insulating film 11 is made to contribute to the increase in capacitance and, therefore, the present embodiment is considered to be different from the prior arts.

Figure 2:
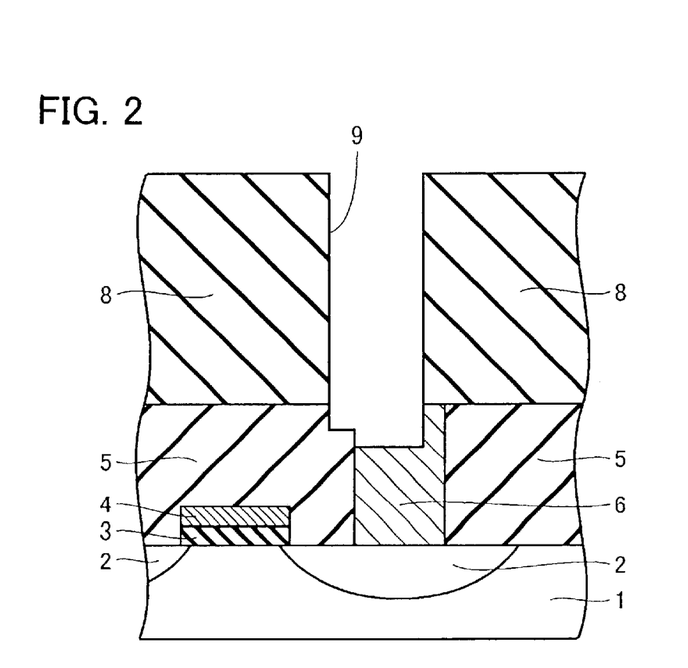
FIG. 2 is a diagram for describing a process for a semiconductor device which includes a capacitor having the damascene pillar-type cell of the first embodiment.

Next, in reference to FIGS. 2 to 7, a process for a semiconductor device of the present embodiment is described. First, as shown in FIG. 2, a contact hole 9 is created so as to penetrate silicon oxide film 8 and to reach to contact plug 6 in a similar manner to the prior arts. At this time, since a silicon nitride film is not formed, unlike in the prior arts, contact hole 9, which penetrates silicon oxide film 8, is created by etching contact plug 6 and interlayer insulating film 5 without etching the silicon nitride film. Then, in a similar manner as in the prior arts, the bottom of contact hole 9 is formed to have a structure of a step form.

Figure 3:
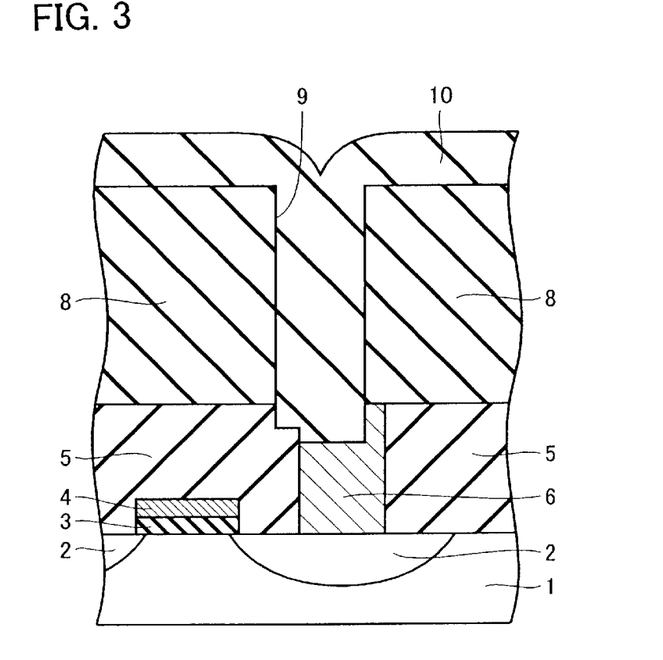
FIG. 3 is a diagram for describing the process for a semiconductor device which includes a capacitor having the damascene pillar-type cell of the first embodiment.
Figure 4:
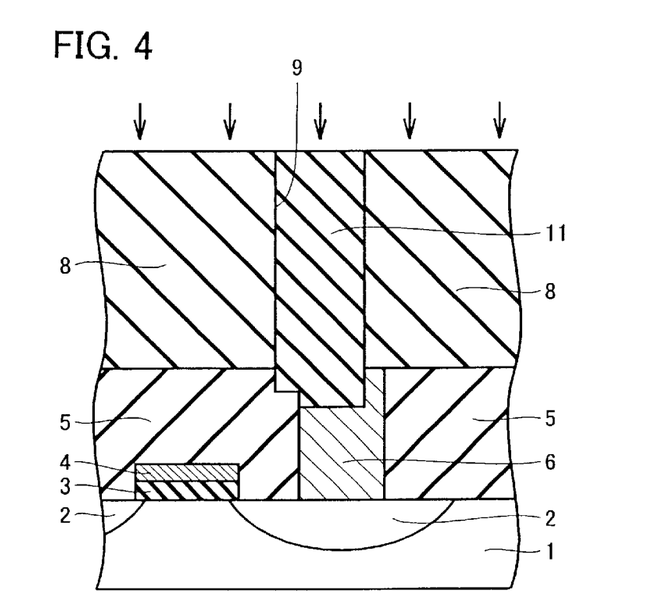
FIG. 4 is a diagram for describing the process for a semiconductor device which includes a capacitor having the damascene pillar-type cell of the first embodiment.
Figure 5:
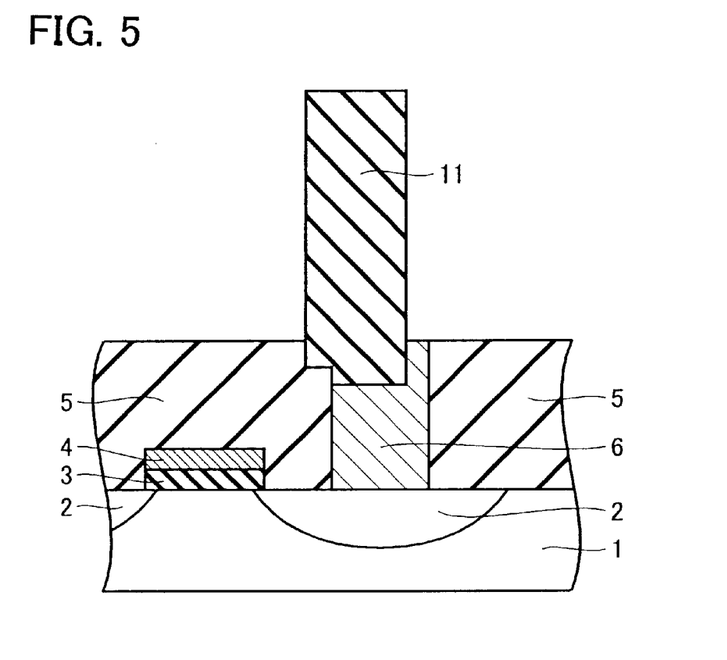
FIG. 5 is a diagram for describing the process for a semiconductor device which includes a capacitor having the damascene pillar-type cell of the first embodiment.

Next, as shown in FIG. 3, a dielectic material 10 which becomes a core insulating film is formed so as to be filled into contact hole 9 and to cover the top surface of silicon oxide film 8. Next, as shown in FIG. 4, dialectic material 10, which becomes a capacitor dielectric film on the top surface of silicon oxide film 8 is etched back. After that, as shown in FIG. 5, silicon oxide film 8 is removed through etching so that core insulating film 11, which becomes the core, is exposed.

Figure 6:
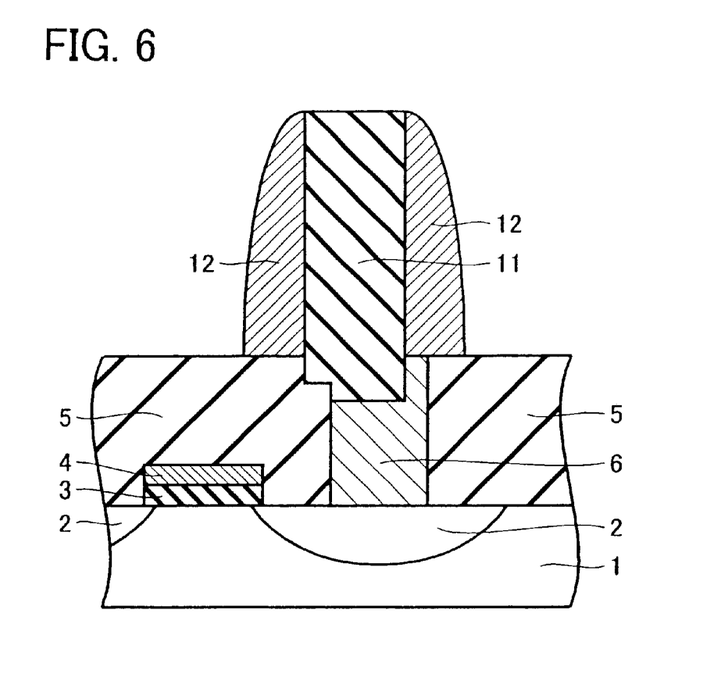
FIG. 6 is a diagram for describing the process for a semiconductor device which includes a capacitor having the damascene pillar-type cell of the first embodiment.
Figure 7:
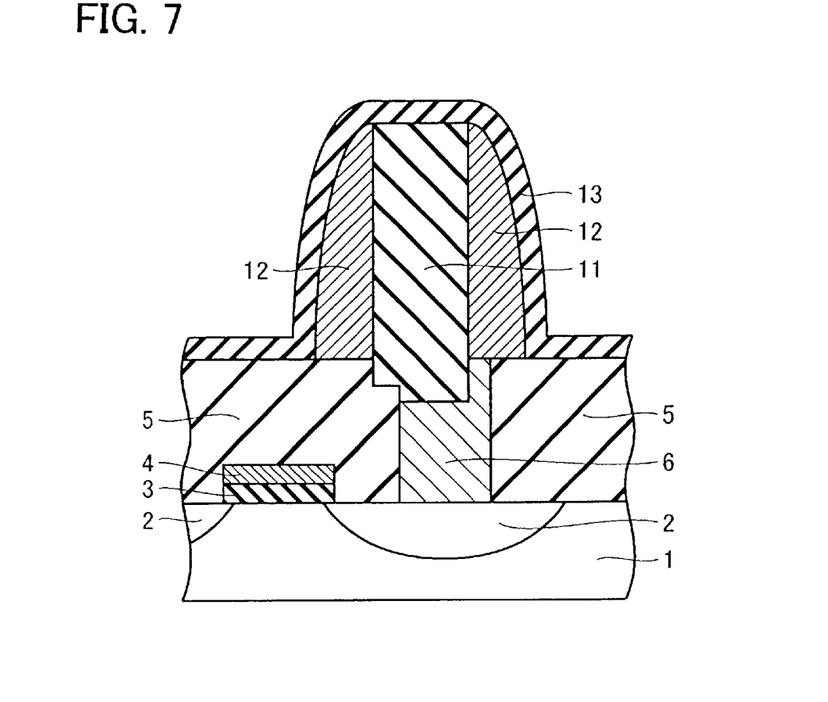
FIG. 7 is a diagram for describing the process for a semiconductor device which includes a capacitor having the damascene pillar-type cell of the first embodiment.

Next, as shown in FIG. 6, a side wall film, which becomes capacitor lower electrode 12, is formed and a dielectric film 13, which becomes capacitor dielectric film 13a, is formed so as to cover the top surface of interlayer insulating film 5. After that, a metal, which becomes capacitor upper electrode 14a, is formed and, subsequently, the edge parts of dielectric film 13 and the metal are etched so as to form a capacitor structure made of capacitor upper electrode 14a, core insulating film 11, capacitor dielectric film 13a and capacitor lower electrode 12, as shown in FIG. 1.

(Second Embodiment)

Figure 8:
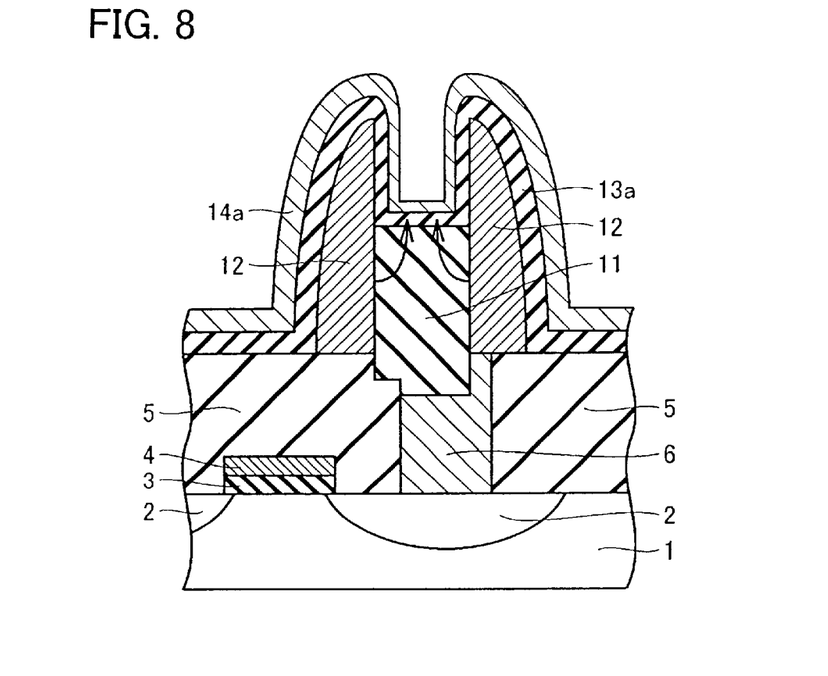
FIG. 8 is a diagram for describing a structure of a semiconductor device which includes a capacitor having the damascene pillar-type cell of a second embodiment.

Next, the structure of a semiconductor device which includes a capacitor having a damascene pillar-type cell of a second embodiment is described in reference to FIG. 8. As shown in FIG. 8, the semiconductor device which includes a capacitor cell of a damascene pillar-type has essentially a similar structure as in the first embodiment shown in FIG. 1 and it is characterized in that the core insulating film 11 which will become the core is lowered by being etched starting from the top part of the metal forming capacitor lower electrode 12 as a side wall film to a predetermined position.

Then, capacitor dielectric film 13a and capacitor upper electrode 14a are formed in layers so as to follow the top surface of core insulating film 11, which becomes the core, and the surface of the metal of capacitor lower electrode 12, which becomes a side wall film. The capacitor of the first embodiment is simply characterized in that the core of the capacitor is replaced with a high dielectric film. In the capacitor of the second embodiment, however, the replacement has only a small effect on the improvement of the capacitance of the capacitor when taking into consideration that the film thickness of the dielectric film between the bottom surface part of capacitor upper electrode 14a and the inner surface of capacitor lower electrode 12 becomes considerably thick. Therefore, this effect is compensated for by increasing the area where capacitor upper electrode 14a and capacitor lower electrode 12 face each other.

By using such a structure, as shown in the first embodiment, it becomes possible to increase the area where the capacitor upper electrode and the capacitor lower electrode face each other while utilizing core insulating film 11 as a capacitor dielectric film so that the capacitance of the capacitor can be expected to increase further.

As for the reason for the above, though it is a disadvantageous point, more precisely, the upper part of the dielectric film of which the dielectric constant is the highest cannot be utilized, in comparison with the first embodiment, the decrease in the dielectric constant is not strongly dependent on film thicknesses of approximately 30 nm, or over, so that a similar level of the dielectric constant as that of the dielectric film in the first embodiment may be expected in the capacitor cell of which the height is several hundreds of nm.

Figure 9:
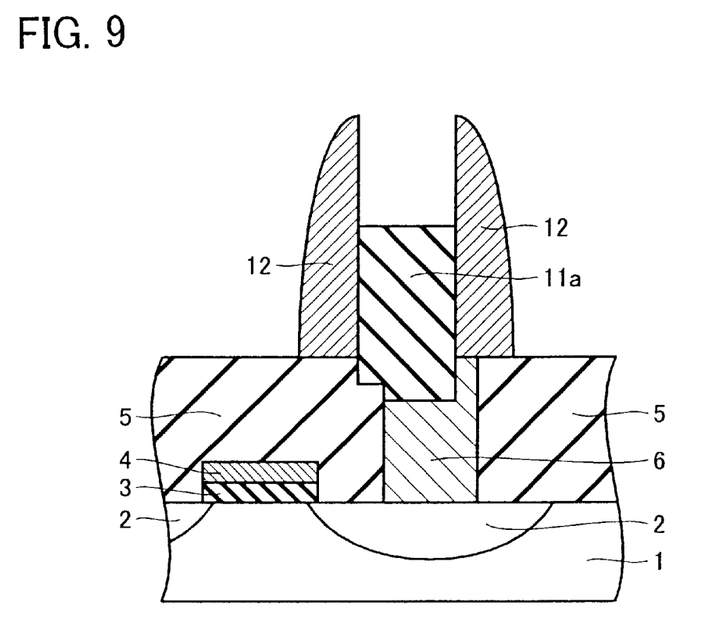
FIG. 9 is a diagram for describing a process for a semiconductor device which includes a capacitor having the damascene pillar-type cell of the second embodiment.
Figure 10:
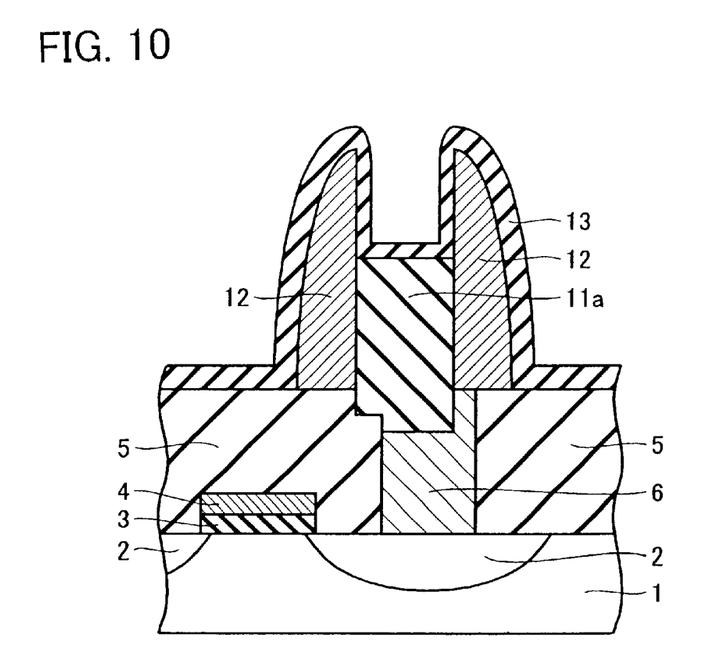
FIG. 10 is a diagram for describing the process for a semiconductor device which includes a capacitor having the damascene pillar-type cell of the second embodiment.

Next, in reference to FIGS. 9 and 10, a process for a semiconductor device which includes a capacitor having a damascene pillar-type cell of the present embodiment is described. In a process for a semiconductor device of the present embodiment steps similar to those in the first embodiment are carried out up to the step shown in FIG. 6.

That is to say, in the structure as shown in FIG. 21 according to the prior art, the metal of the core part of the capacitor is replaced with a dielectric film and, as shown in FIG. 6, an etch back of the metal which becomes capacitor lower electrode 12 is carried out until the top surface of the dielectric film, which becomes the core insulating film 11, is exposed. After that, the top surface of core insulating film 11a that is formed by etching the upper part of the dielectric film of core insulating film 11, which becomes the core, is positioned lower than the upper edge of capacitor lower electrode 12. Thereby, the structure as shown in FIG. 9 is gained.

After that, a capacitor dielectric film 13 is formed so as to cover the top surface of core insulating film 11a, which becomes the core, and the surface of the side wall film, which becomes the metal of capacitor lower electrode 12. Then, a metal 14, which becomes capacitor upper electrode 14a, is formed so as to cover the surface of capacitor dielectric film 13 and, after that, the structure as shown in FIG. 8 is gained by etching away unnecessary parts.

(Third Embodiment)

Figure 11:
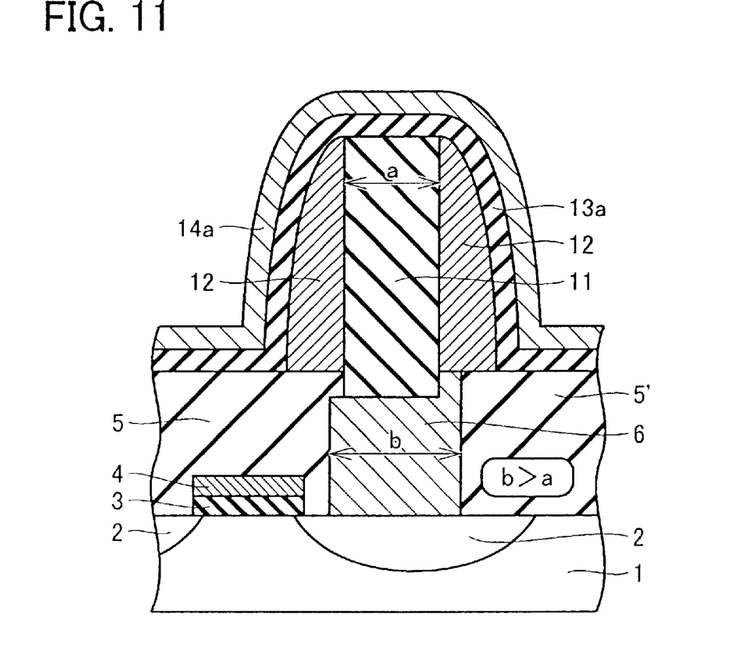
FIG. 11 is a diagram for describing a structure of a semiconductor device which includes a capacitor having the damascene pillar-type cell of a third embodiment.

Next, the structure of a semiconductor device which includes a capacitor having a damascene pillar-type cell of a third embodiment is described. As shown in FIG. 11, the semiconductor device which includes a capacitor having a damascene pillar-type cell of the present embodiment is characterized in that the width of contact plug 6 which penetrates interlayer insulating film 5 is larger than the width of core insulating film 11, which becomes a later formed core, in a predetermined cross section of the core insulating film.

The framing damascene pillar structure introduced in the first and second embodiments is a measure to prevent misalignment and the contact plug is formed so as to be, normally, thinner than the core and contrarily, therefore, in the case that misalignment has not occurred, core insulating film 11 makes contact with the top surface of contact plug 6 so as to cover the entirety of the top surface of contact plug 6 so that an electrical connection is not made between contact plug 6 and capacitor lower electrode 12.

Therefore, as shown in FIG. 11, the width to contact plug 6 is greater than the width of core insulating film 11 in the cross section of core insulating film 11. In such a manner, an electronic connection between contact plug 6 and capacitor lower electrode 12 can be surely carried out, even in the case that the alignment is perfect, while strongly compensating against misalignment between contact plug 6 and core insulating film 11.

Figure 12:
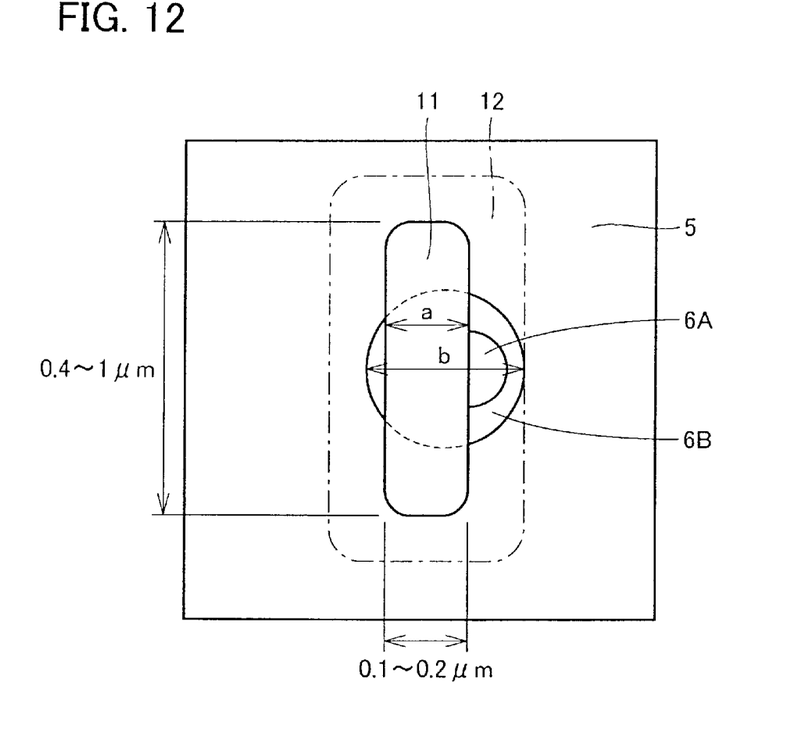
FIG. 12 is a diagram for describing the structure of a semiconductor device which includes a capacitor having the damascene pillar-type cell of the third embodiment.

In addition, in the case that core insulating film 11, capacitor lower electrode 12 and contact plug 6, described in the above first to third embodiments, are viewed from the top the relationships between contact plug 6a in the case of the first and second embodiments and contact plug 6b in the case of the third embodiment are such as shown in FIG. 12. As can be seen from this figure, in the case that width b is larger than width a of core insulating film 11 as in contact plug 6b, the entirety of top surface of contact plug 6 is accidentally placed in the inside of the lower surface of core insulating film 11 when core insulating film 11 is positioned above contact plug 6 and, therefore, contact plug 6 and capacitor lower electrode 12 are prevented from failing to make an electrical connection.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a core insulating film serving as a core of a capacitor formed on a semiconductor substrate;
   a capacitor lower electrode formed so as to cover a side surface of the core insulating film;
   a capacitor dielectric film formed on a surface of the capacitor lower electrode and directly on a top surface of said core insulating film; and
   a capacitor upper electrode formed so as to cover a surface of the capacitor dielectric film,
   wherein a bottom surface of said core insulating film is located below a bottom surface of said capacitor lower electrode.

2. The semiconductor device according to claim 1, wherein the top surface of said core insulating film is in a position lower than a top edge of said capacitor lower electrode.

3. The semiconductor device according to claim 1, further comprising a plug electrically connected to said capacitor lower electrode,
   wherein the width of said plug is larger than the width of said core insulating film in a predetermined cross section of said core insulating film.

4. The semiconductor device according to claim 3, wherein the connection portion wherein the bottom surface of said core insulating film is connected to said plug and the portion other than the connection portion form a step form.

5. The semiconductor device according to claim 1, wherein said core insulating film is a high dielectric film.

* * * * *